(12) United States Patent
Hemon

(10) Patent No.: US 8,243,405 B2
(45) Date of Patent: Aug. 14, 2012

(54) CIRCUIT, INTEGRATED CIRCUIT AND METHOD FOR DISSIPATING HEAT FROM AN INDUCTIVE LOAD

(75) Inventor: Erwan Hemon, Goyrans (FR)

(73) Assignee: Freescale Semiconductor, Inc., Austin, TX (US)

( * ) Notice: Subject to any disclaimer, the term of this patent is extended or adjusted under 35 U.S.C. 154(b) by 333 days.

(21) Appl. No.: 12/595,378

(22) PCT Filed: Apr. 23, 2007

(86) PCT No.: PCT/IB2007/052682
§ 371 (c)(1),
(2), (4) Date: Oct. 9, 2009

(87) PCT Pub. No.: WO2008/129365
PCT Pub. Date: Oct. 30, 2008

(65) Prior Publication Data
US 2010/0109623 A1    May 6, 2010

(51) Int. Cl.
*H02H 3/22* (2006.01)
(52) U.S. Cl. .......................... 361/56; 361/111
(58) Field of Classification Search .............. 361/56, 361/91, 111
See application file for complete search history.

(56) References Cited

U.S. PATENT DOCUMENTS

| | | | | |
|---|---|---|---|---|
| 5,465,190 A | * | 11/1995 | Meunier et al. | 361/91.5 |
| 5,818,678 A | | 10/1998 | Berg et al. | |
| 5,939,908 A | * | 8/1999 | Moore et al. | 327/108 |
| 6,314,002 B1 | | 11/2001 | Qian et al. | |
| 6,992,520 B1 | * | 1/2006 | Herbert | 327/377 |
| 7,080,639 B1 | * | 7/2006 | Pattantyus | 123/651 |

FOREIGN PATENT DOCUMENTS
DE    10020137 A1    10/2001

OTHER PUBLICATIONS

Bendien J C et al: "Recovery Circuit for Snubber Energy in Power Electronic Applications with High Switching Frequencies" IEEE Transactions on Power Electronics, IEEE Service Center, Piscataway, NJ, vol. 3, No. 1, Jan. 1988.
International Search Report and Written Opinion correlating to PCT/IB2007/052682 dated Feb. 5, 2008.

* cited by examiner

*Primary Examiner* — Danny Nguyen

(57) ABSTRACT

A circuit comprises an inductive load. The circuit further comprises an energy-absorbing component operably coupled to the inductive load and arranged to absorb energy generated by the inductive load.

20 Claims, 5 Drawing Sheets

CIRCUIT, INTEGRATED CIRCUIT AND METHOD FOR DISSIPATING HEAT FROM AN INDUCTIVE LOAD

FIELD OF THE INVENTION

The technical field relates generally to a dissipation circuit, and in particular to a dissipation circuit for an inductive load driver.

BACKGROUND

Transistors, and in particular field effect transistors (FETs), are widely used to drive inductive loads. For example, in the automotive industry, Power FETs are used to drive solenoid valves in antilock brake systems (ABS) as well as electronic stabilisation program (ESP) systems.

Inductive loads comprise the characteristics of an electrical conductor that opposes a change in current flow, exhibiting the same effect on current in an electric circuit as inertia does on velocity of a mechanical object.

An inductive load stores energy in a magnetic field. When the current changes direction, or stops, or the magnetic field changes, an electromotive force (emf) is induced back into the conductor through collapsing of the magnetic field. The opposition to the changes in current flow is identified as counter electromotive force (counter emf). The amount of counter emf is in proportion to the rate of change, that is the faster the rate of change of, voltage across the inductive load or current passed through the inductive load, the greater the counter emf.

A consequence of counter emf is that when an inductive load experiences a sudden change in power, it can cause a large counter emf, resulting in a large voltage spike.

It is known for inductive load driver circuits to comprise re-circulation clamps, in order to protect the circuits from the effects of such voltage spikes. FIG. 1 illustrates an example of a known inductive load driver circuit 100.

The circuit 100 comprises an inductive load L1, coupled to one end to a supply voltage Vsup, and to a drain of a transistor M1. The source of the transistor M1 is coupled to ground. The transistor M1 acts as a switch between the inductive load L1 and the ground plane, and effectively drives the inductive load L1.

With such a circuit configuration, when the transistor M1 is switched 'on', the voltage at Vox is substantially equal to zero (i.e. connected to ground), creating a potential difference across the inductive load L1, and thereby causing current flow through the inductive load L1. As previously mentioned, inductive loads comprise the characteristics of an electrical conductor that opposes a change in current flow. Consequently, the current flow starts low and increases as the inductive load L1 stores energy in a form of a magnetic field.

When the transistor M1 is switched 'off', Vox is no longer grounded, and the inductive load L1 experiences a change in voltage across it. The change in voltage creates a counter emf, caused by a collapse of the magnetic field. The counter emf causes current to continue flowing through the inductive load L1 as the energy previously stored in the magnetic field is released, and is proportional to the rate of change of the voltage across the inductive load. The continued flow of current through the inductive load L1 causes an increase in the voltage at Vox in the form of a voltage spike.

If the voltage at Vox increases too much, it will exceed the breakdown (or avalanche) voltage of the transistor M1.

To protect the transistor M1 from such voltage increases at its drain, the inductive load driver circuit 100 sometimes comprises a re-circulation clamp in a form of a zener diode Z1. The cathode of the zener diode Z1 is coupled to the drain of the transistor M1 and the anode of the zener diode Z1 is coupled to the gate of the transistor M1, as illustrated.

The zener diode Z1 is configured such that, when a voltage increase is created at Vox, due to the transistor M1 being switched 'off', the breakdown voltage of the zener diode Z1 is reached before that of the transistor M1. In this way, when the breakdown voltage of the zener diode Z1 is reached, current flows through the zener diode Z1, thereby limiting the voltage at Vox to that of the breakdown voltage of the zener diode Z1.

The resulting current flowing through the zener diode Z1 also flows through a resistor R1 to ground. The flow of current through the resistor R1 creates a potential difference across resistor R1, and thus between the gate and source of transistor M1. Consequently, if the flow of current through the zener diode Z1 is sufficiently great, it will cause the potential difference across the resistor R1, and thereby between the gate and source of the transistor M1, to become sufficient to turn the transistor M1 'on', thereby allowing current to flow from Vox to ground.

In this manner, when a voltage spike of sufficient magnitude is experienced, the zener diode Z1, not only protects the transistor M1 by limiting the voltage between the drain and gate to that of the breakdown voltage of the zener diode Z1, it also switches the transistor M1 back 'on', enabling further current to flow to ground through the transistor M1. In this way, the energy from the voltage spike is dissipated through the zener diode Z1, and more significantly through the transistor M1.

As will be appreciated by a skilled artisan, energy is dissipated in a form of heat generated as the current flows through the transistor M1. Consequently, the transistor M1 is limited to being of a minimum size, in order to be capable of dissipating sufficient heat so that the component is not susceptible to overheating.

As will also be appreciated by a skilled artisan, it is desirable to minimise an overall footprint of an integrated circuit (IC) package comprising such an inductive load driver circuit in order to minimise cost. Clearly, the limitation of a minimum size for the transistor M1 subsequently limits the minimisation of the footprint of the IC package. Furthermore, since an IC package in general comprises a plurality of inductive load driver circuits, and therefore a plurality of transistors, the problem aforementioned footprint size is further compounded.

As technology has progressed, switching speeds of inductive driver circuits has been improved significantly. Although such switching speed increases has improved the responsiveness of such drivers circuits, the increase in switching speeds also results in an increase in the rate of change experienced by the inductive load. Consequently, the voltage spike created by the counter emf is increased.

The result is that, although the same amount of energy may be generated, it is generated over a shorter period of time. Consequently, the inductive load driver circuit, and more particularly the transistor, is required to dissipate heat (energy) over a shorter period of time. This in turn requires the transistor (heat dissipation area) to increase in size in order to be able to dissipate the generated heat. The energy to be dissipated is:

$$E=0.5*L*I^2 \quad [1]$$

Consequently, as technology progresses further, rather than the IC packages becoming smaller, they are in fact increasing in size, further compounding the problem of heat dissipation.

Thus, there is a need for an improved circuit integrated circuit and method for dissipating energy released from an inductive load.

BRIEF DESCRIPTION OF THE DRAWINGS

Exemplary embodiments of the invention will now be described, by way of example only, with reference to the accompanying drawings, in which.

DETAILED DESCRIPTION OF EMBODIMENTS OF THE INVENTION

Figure 1:
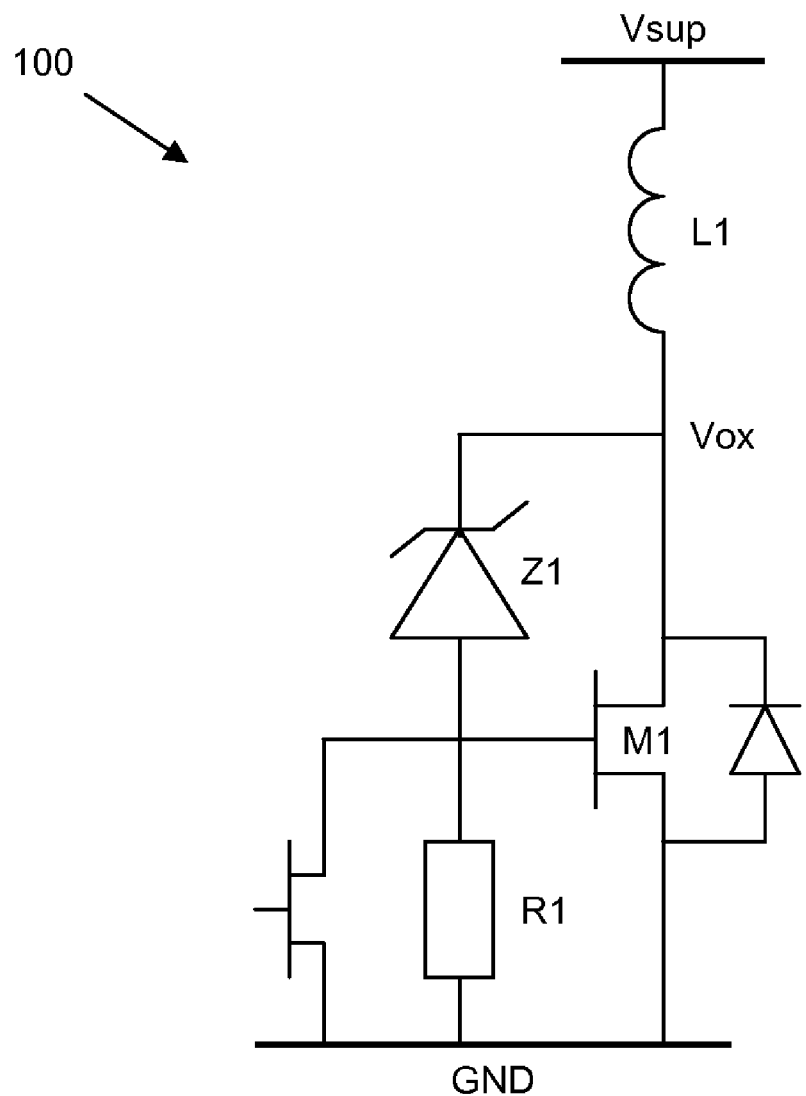
FIG. 1 illustrates an example of a known inductive load driver circuit.

Before describing in detail embodiments that are in accordance with the invention, it should be observed that the various apparatus components described herein, and as shown in the accompanying drawings, have been represented where appropriate by conventional symbols in the drawings, showing only those specific details that are pertinent to understanding the embodiments of the invention, so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

Figure 2:
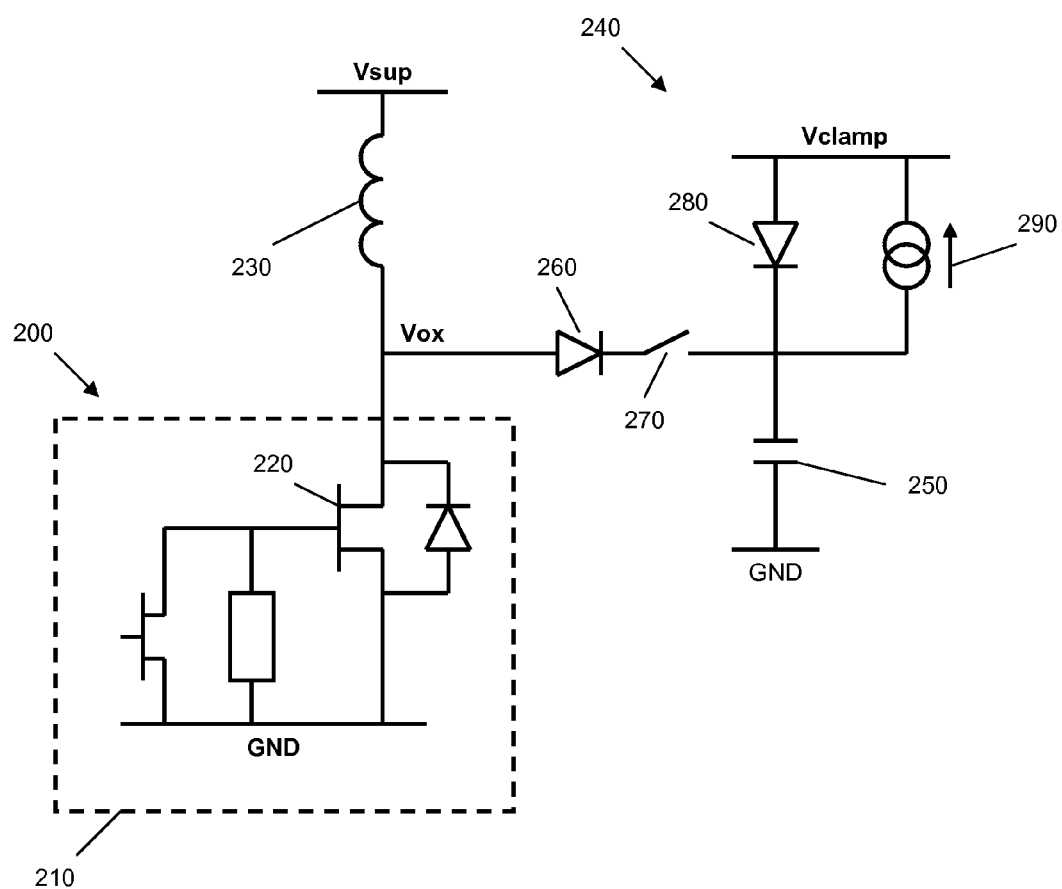
FIG. 2 illustrates a dissipation circuit in accordance with an exemplary embodiment of the invention.

Referring now to FIG. 2, there is illustrated an exemplary embodiment of a dissipation circuit according to the invention concept herein described.

A part of an inductive load driver circuit 200, which may be provided within an integrated circuit (IC) package 210, is shown. The part of the inductive load driver circuit 200 comprises a transistor 220, which for the illustrated embodiment is in a form of a metal oxide semiconductor field effect transistor (MOSFET). The transistor 220 is arranged to drive an inductive load 230, such as a solenoid or the like forming part of an anti-lock braking system (ABS) or an electronic stabilisation program (ESP) system of a vehicle.

In accordance with the invention, the inductive load driver circuit 200 is coupled to a dissipation circuit 240. The dissipation circuit 240 comprises an energy-absorbing component, which for the illustrated embodiment is in a form of a capacitor 250.

The inductive load 230 is coupled at one end to a supply voltage Vsup, and at the other end to the drain of transistor 220. The source of the transistor 220 is coupled to ground. The transistor 220 acts as a switch between the inductive load 230 and the ground pane, driving the inductive load 230.

When the transistor 220 is switched 'on', the voltage at Vox is substantially equal to zero, (connected to ground), creating a potential difference across the inductive load 230, and causing current flow through the inductive load 230.

When the transistor 220 is switched 'off', Vox is no longer grounded, and the inductive load 230 experiences a change in voltage across it. The change in voltage creates a counter electromotive force (emf), caused by a collapse of the magnetic field. The counter emf causes current to continue flowing through the inductive load 230 as energy previously stored in the magnetic field is released, and is proportional to a rate of change of voltage across the inductive load 230. The continued flow of current through the inductive load 230 causes an increase in voltage at Vox, in a form of a voltage spike.

If the voltage at Vox increases too much, it will exceed the breakdown, or avalanche, voltage of the transistor 220.

For known inductive load drive circuits, protection is provided within the driver circuit itself, and more particular by the transistor 220 itself. However, this has a disadvantage of the transistor 220, or more particularly the silicon from which the transistor is formed, being required to dissipate the energy released by the inductive load.

By contrast, in accordance with an exemplary embodiment of the invention, the inductive load is coupled to an energy-absorbing component, which for the illustrated embodiment is in a form of the capacitor 250. In this manner, the energy released from the inductive load 230 is absorbed by, in this case, capacitor 250. As a result, although transistor 220 experiences a voltage spike, the current flow there through, and thereby the energy required to be absorbed by the transistor 220, is substantially zero. In this way, the transistor 220 is substantially protected from the energy release.

Furthermore, by initially storing the energy, the need to dissipate energy quickly (for example almost instantaneously) in order to prevent damage to, or overheating of, components is substantially alleviated. Advantageously, the stored energy may then be dissipated over a longer period of time (for example, over say 100 msec to 1 sec. as compared to 500 usec in the known prior art). This provides a significant advantage since, for a given energy, the longer the time over which the energy can be dissipated, the less heat will be generated in dissipating the stored energy, and as such the less likelihood of damage to components.

Furthermore, the stored energy may be provided to a different circuit or module (not illustrated) of the system or device in which the inductive load driver circuit is employed, thereby providing effectively 'free' power/energy, often referred to as 'regeneration'.

For example, capacitor 250 is a high voltage energy source when storing the released energy, and as such may be used in addition to, or instead of, having a charge pump, which would consume a significant current to be able to generate a similar high voltage. Advantageously, this improves energy efficiency, and possibly also removes a need for a charge pump altogether, thereby freeing up space within a die or the like.

Alternatively, energy stored within the capacitor may be used to supplement and/or replace a boost converter, used to generate a high voltage from a low voltage, thereby providing the same advantages as for employing a charge pump.

Referring back to FIG. 2, a more detailed explanation of the operation of the dissipation circuit 240 is provided. For the illustrated embodiment, the capacitor 250 comprises two connections, an anode and a cathode. The anode is coupled to ground, whilst the cathode is coupled to: Vox, via a diode 260 and a switch 270; and a Vclamp source, via a diode 280 and a current drain 290. In an alternative embodiment, the current drain 290 may be provided within the IC package 210. Furthermore, the capacitor may be coupled to Vox by any suitable alternative components, for example a sync switch with no reverse current.

A purpose of switch 270 is to disconnect the dissipation circuit 240 during a 'start up' operation. Without switch 270 being coupled in series with diode 260, when Vsup rises at the start, the current would flow through the inductive load 230, into capacitor 250. This flow of current through the inductive load 230 would activate the inductive load 230. As will be appreciated by a skilled artisan, where the inductive load driver circuit 200 forms part of, for example, an ABS system, this would affect the brakes of the vehicle, and as such is unacceptable. Thus, the switch 270 is arranged to be open during this initial start up period to prevent such current flow.

As described in more detail below, Vclamp is arranged to comprise a higher voltage than Vsup. Consequently, once Vclamp has risen to its required voltage value, following start up, and sufficient current has flowed into capacitor 250, diode 260 prevents current flowing to Vox from Vclamp. Hence, no current will flow through the inductive load 230. Thus, once Vclamp has risen to its required value, the switch 270 may be closed.

When the transistor 220 is switched 'on', Vox is effectively grounded, causing current to flow through the inductive load 230, thereby causing the inductive load 230 to store energy in a form of a magnetic field.

As previously mentioned, when the transistor 220 is subsequently switched 'off', Vox is no longer grounded, and the inductive load 230 experiences a change in voltage across it. The change in voltage creates a counter electromotive force (emf), caused by a collapse of the magnetic field. The counter emf causes current to continue flowing through the inductive load 230 as energy previously stored in the magnetic field is released, and is proportional to the rate of change of the voltage across the inductive load 230. The continued flow of current through the inductive load 230 causes a comparable increase in voltage at Vox.

When the voltage at Vox exceeds Vclamp, current flows from Vox through diode 260 (and closed switch 270) and into capacitor 250. As previously mentioned, the value of Vclamp is greater than that of Vsup, but is arranged to be less than the breakdown voltage of transistor 220. In this manner, current will flow through diode 260 into capacitor 250 before Vox exceeds a breakdown voltage of transistor 220. Pre-charging circuitry, which for the illustrated embodiment comprises diode 280, enables the capacitor 250 to be pre-charged to Vclamp. Once the capacitor 250 has been pre-charged, the diode 280 acts to isolate Vclamp source once the capacitor 250 has been pre-charged. As will be appreciated by a skilled artisan, alternative methods of pre-charging the capacitor 250 to Vclamp may be used, for example using a switch or comparator.

Furthermore, as capacitor 250 begins to absorb the current from the inductive load 230, the current drain 290 drains the current back to Vclamp, thereby dissipating energy and heat. The capacitor 250 stores excess current from the inductive load 230, thereby allowing the current drain 290 to dissipate the energy and heat over an extended period of time, thus significantly reducing an amount of heat generated. Consequently, the current drain 290 requires a significantly smaller surface area from which to dissipate heat, than would otherwise be required if the energy released by the inductive load 230 was required to be dissipated almost instantaneously.

As will be appreciated by a skilled artisan, the inventive concept provides a significant advantage in allowing energy released by the inductive load 230 to be dissipated over an extended period of time, since the amount of heat generated is significantly reduced. Advantageously, this allows a significant reduction in a size of components tasked with dissipating the energy/heat.

Furthermore, by removing the components required to dissipate the heat from the integrated circuit (IC) package comprising the inductive load driver circuit, this IC can be significantly reduced in size and cost, further allowing advantages gained through technological advances to be realised.

Figure 3:
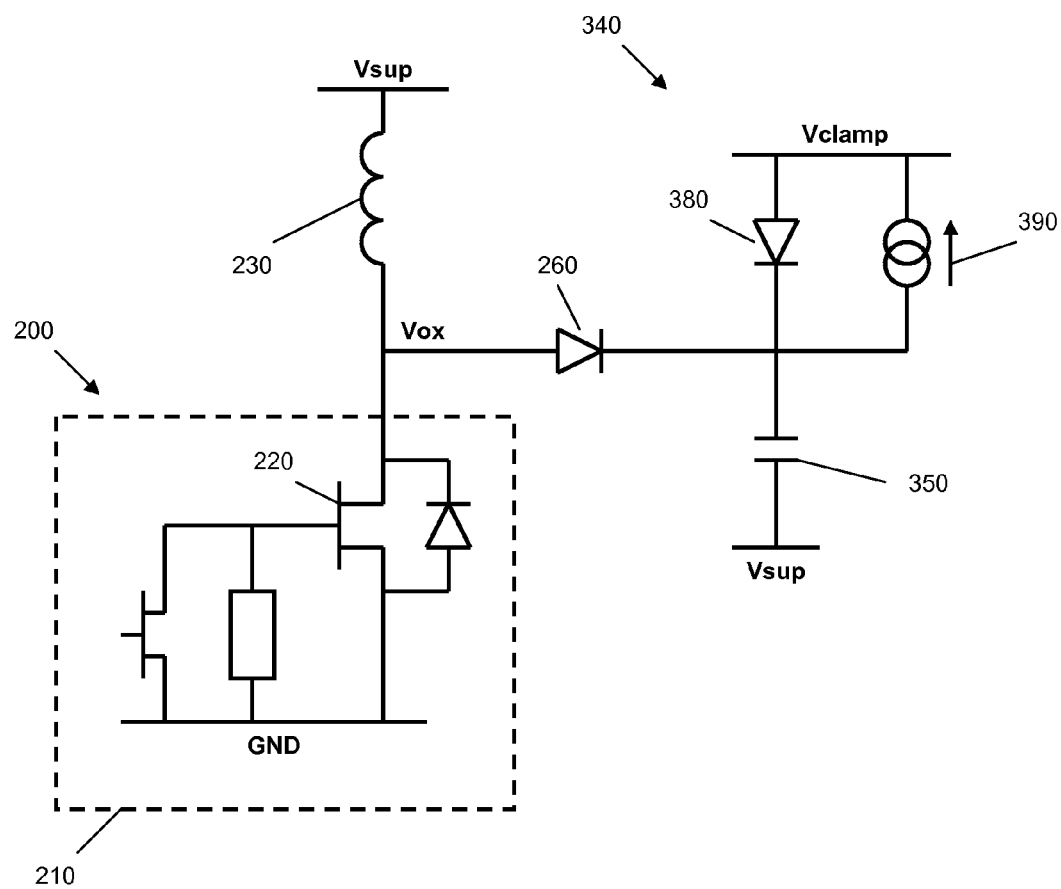
FIG. 3 illustrates a dissipation circuit in accordance with an alternative embodiment of the invention.

Referring to FIG. 3, there is illustrated an alternative embodiment of a dissipation circuit according to the invention. As for the embodiment illustrated in FIG. 2, there is shown a part of the inductive load driver 200, provided within an integrated circuit (IC) package 210. The part of the inductive load driver 200 comprises the transistor 220, which is adapted to drive the inductive load 230.

In accordance with this alternative embodiment of the invention, the inductive load driver circuit 200 is coupled to a dissipation circuit 340. The dissipation circuit 340 again comprises an energy-absorbing component, which for the illustrated embodiment is also in a form of a capacitor 350.

The capacitor 350 comprises two connections, an anode and a cathode. The anode is coupled to Vsup, as opposed to ground for the embodiment illustrated in FIG. 2, whilst the cathode is coupled to Vox, via a diode 360; and a Vclamp source, via a diode 380 and a current drain 390.

As will be appreciated by a skilled artisan, for the embodiment illustrated in FIG. 3, the need for a switch between Vox and the capacitor 350 (in FIG. 2) is substantially alleviated by coupling the anode of the capacitor to Vsup. However, since Vclamp is greater than Vsup, the dissipation circuit 350 will still operate in the same manner as for the embodiment illustrated in FIG. 2.

Figure 4:
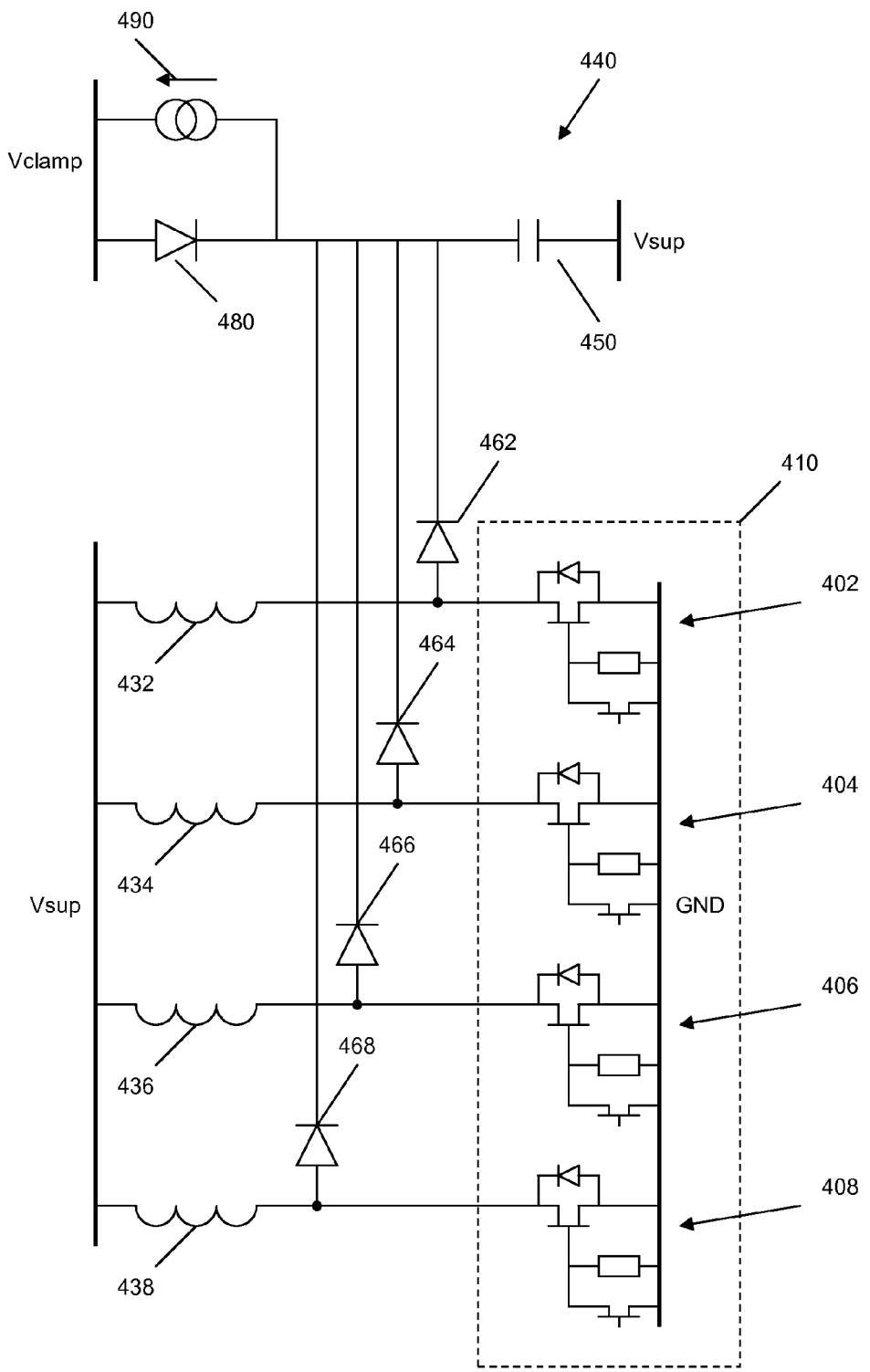
FIG. 4 illustrates a dissipation circuit in accordance with a further alternative embodiment of the invention.

Referring now to FIG. 4, there is illustrated a further alternative embodiment of the invention. An integrated circuit (IC) 410 comprises a plurality of inductive load driver circuits 402, 404, 406, 408. Each of the inductive load circuits 402, 404, 406, 408 drives an inductive load 432, 434, 436, 438 respectively.

In accordance with this further alternative embodiment of the invention, the inductive load driver circuits 402, 404, 406, 408 are coupled to a dissipation circuit 440. The dissipation circuit 440 comprises an energy-absorbing component, which for the illustrated embodiment is also in a form of a capacitor 450.

The capacitor 450 comprises two connections, an anode and a cathode. The anode is coupled to Vsup, whilst the cathode is coupled to each of the inductive load driver circuits via diodes 462, 464, 466, 468 and a Vclamp source, via a diode 480 and a current drain 490.

In this manner, the dissipation circuit 440 absorbs and dissipates energy released from each of the inductive loads 432, 434, 436, 438. As will be appreciated by a skilled artisan, the advantages afforded by the inventive concept, and in particular by substantially alleviating a need for components to be located within the IC 410 that are capable of dissipating energy released by the inductive loads 432, 434, 436, 438 are increased. In particular, these advantages may be released, in terms of a significant saving in term of size and cost of the IC.

Figure 5:
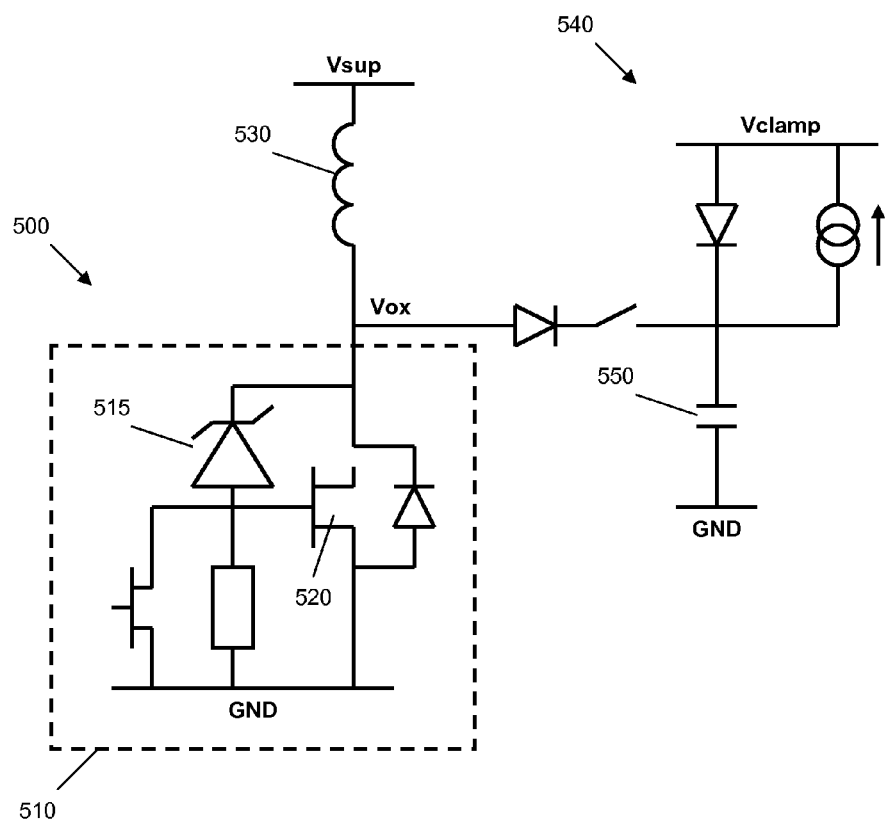
FIG. 5 illustrates a dissipation circuit in accordance with a still further alternative embodiment of the invention.

Referring now to FIG. 5, there is illustrated a still further embodiment of the invention, comprising an inductive load driver circuit 500 and a dissipation circuit 540, similar to the dissipation circuit of FIG. 2.

For this embodiment of the invention, the inductive load driver circuit 500 is located within an integrated circuit package 510, which comprises an internal dissipation circuit in a form of a zener diode 515, in addition to the (external) dissipation circuit 540. The zener diode 515 provides protection, as is known in the art. In this manner, the dissipation circuit 540 of the invention provides supplementary protection and energy absorption/dissipation to that of traditional methods.

In particular, transistor 520, used for driving inductive load 530, comprises a certain amount of intrinsic dissipation ability. As such, transistor 520 is capable of absorbing energy during a voltage spike caused by the collapse of the magnetic field of the inductive load 530, following a turn 'off' of the transistor 520. The zener diode 515 allows recirculation of the current into the transistor 520.

The supplementary protection and energy absorption/dissipation provided by the external dissipation circuit 540 results in the transistor 520 being required to enter this 'recirculation mode' for significantly reduced lengths of time than for traditional methods. In this manner, whilst the transistor 520 is utilised to absorb and dissipate some of the energy generated by the collapse of the magnetic filed of the inductive load 530, the supplementary absorption/dissipation provided by the external dissipation circuit 540 substantially alleviates the need for the size the transistor 520 to be undesirably large.

Furthermore, utilising the intrinsic energy absorption/dissipation ability of the transistor 520, the absorption/dissipation requirements for the external dissipation circuit 540 are reduced, thus, enabling a reduction in size and/or cost for such an external circuit.

In the foregoing specification, specific embodiments of the invention have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the present invention.

Although the invention has been described herein with reference to forming part of an anti-lock braking system (ABS) or an electronic stabilisation program (ESP) system of a vehicle, it will be appreciated by a skilled artisan that the inventive concept may be applied to a wide range of inductive applications, such as motors, injectors, valves, etc.

The benefits, advantages, solutions to problems, and any element(s) that may cause any benefit, advantage, or solution to occur or become more pronounced are not to be construed as a critical, required, or essential feature(s) or element(s) of any or all of the claims.

The invention is defined solely by the appended claims include any amendments made during the pendency of this application and all equivalents of those claims as issued.

Moreover in this document, the terms 'comprises', 'comprising', 'has', 'having', 'includes', 'including', 'contains', 'containing' or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus.

An element preceded by 'comprises . . . a', 'has . . . a' 'includes . . . a', 'contains . . . a' does not, without more constraints, preclude an existence of additional identical elements in the process, method, article, or apparatus that comprises, has, includes, contains the element. The terms 'a' and 'an' are defined as one or more unless explicitly stated otherwise herein.

The terms 'substantially', 'generally', 'essentially', 'approximately', 'about' or an other version thereof, are defined as being close to as understood by one or ordinary skill in the art.

The term 'coupled' as used herein is defined as connected, although not necessarily directly and not necessarily mechanically. A device or structure that is 'configured' in a certain way is configured in at least that way, but may also be configured in ways that are not listed.

Thus, an improved circuit for dissipating energy released from an inductive load has been described that substantially alleviates one or more problems associated with known inductive load circuits.

The invention claimed is:

1. A circuit comprising:
an energy-absorbing component operably coupled to an inductive load and a current drain, the energy-absorbing component is arranged to absorb energy generated by the inductive load, and the energy-absorbing component comprises:
a capacitor having:
a cathode coupled to the current drain; and
an anode coupled to an anode voltage;
a diode operably coupled between the energy-absorbing and the inductive load; and
a switch in series with the diode, the switch configured to coupled the energy-absorbing component to the inductive load;
wherein the capacitor is arranged to store energy generated by the inductive load and the current drain is arranged to remove the stored energy when the anode voltage is greater than a clamp voltage.

2. The circuit of claim 1 wherein an inductive load driver is located in an integrated circuit package and the energy-absorbing component is located external thereto.

3. The circuit of claim 2 wherein the integrated circuit package comprises an internal dissipation circuit.

4. The circuit of claim 1 wherein the anode is coupled to a voltage supply to which the inductive load is coupled or coupled to ground.

5. The circuit of claim 1 wherein the energy-absorbing component is coupled to a clamping voltage source via the current drain.

6. The circuit of claim 5 wherein the energy-absorbing component is further coupled to the clamping voltage source via pre-charging circuitry.

7. The circuit of claim 6 wherein the pre-charging circuitry comprises a diode located in parallel with the current drain.

8. The circuit of claim 1 wherein the clamping voltage is arranged to be lower than a breakdown voltages of an inductive load driver.

9. The circuit of claim 1 wherein the energy-absorbing component is arranged to stored energy released from a plurality of inductive loads.

10. The circuit of claim 9 wherein the plurality of inductive loads are driven by a plurality of inductive load drivers integrated into a single integrated circuit package.

11. The circuit of claim 1 wherein energy stored by the energy-absorbing component is subsequently used for energy regeneration.

12. The circuit of claim 1 wherein the circuit forms a part of an anti-lock brake system (ABS) or electronic stabilisation program (ESP) system.

13. An anti-lock brake system comprising a circuit according to claim 1.

14. An electronic stabilisation program system comprising a circuit according to claim 1.

15. A method of dissipating energy from a circuit comprising an inductive load; the method comprising:
routing current from the inductive load to an energy-absorbing component comprising a capacitor having a cathode coupled to a current drain and an anode coupled to an anode voltage arranged to store energy generated by the inductive load;

opening a switch coupled between the inductive load and the energy-absorbing component in response to the capacitor charging to a clamp voltage; and dissipating energy from the energy-absorbing component through the current drain operatively coupled to the energy-absorbing component when the anode voltage is greater than the clamp voltage.

16. The method of claim 15 comprising storing energy released from a plurality of inductive loads by the energy-absorbing component.

17. The circuit of claim 2 wherein the energy-absorbing component is coupled to the clamping voltage source via the current drain.

18. The circuit of claim 3 wherein the energy-absorbing component is coupled to the clamping voltage source via the current drain.

19. A circuit comprising:

an energy-absorbing component operably coupled to an inductive load and a current drain, the energy-absorbing component is arranged to absorb energy generated by the inductive load, and the energy-absorbing component comprises:

a capacitor having a cathode coupled to the current drain, and an anode coupled to an anode voltage, wherein the capacitor is arranged to store energy generated by the inductive load and the current drain is arranged to remove the stored energy when the anode voltage is greater than a clamp voltage source; and a diode having an anode coupled to the clamp voltage source, and a cathode coupled to the cathode of the capacitor, the diode located in parallel with the current drain.

20. The circuit of claim 19 wherein an inductive load driver is located in an integrated circuit package and the energy-absorbing component is located external to the integrated circuit package.

* * * * *